(12) United States Patent
Nishimura et al.

(10) Patent No.: US 9,208,997 B2
(45) Date of Patent: Dec. 8, 2015

(54) METHOD OF ETCHING COPPER LAYER AND MASK

(71) Applicant: Tokyo Electron Limited, Tokyo (JP)

(72) Inventors: Eiichi Nishimura, Miyagi (JP); Masato Kushibiki, Miyagi (JP); Takashi Sone, Miyagi (JP); Akitaka Shimizu, Miyagi (JP); Fumiko Yamashita, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 138 days.

(21) Appl. No.: 14/058,621

(22) Filed: Oct. 21, 2013

(65) Prior Publication Data

US 2014/0110373 A1    Apr. 24, 2014

Related U.S. Application Data

(60) Provisional application No. 61/720,978, filed on Oct. 31, 2012.

(30) Foreign Application Priority Data

Oct. 22, 2012 (JP) ................................ 2012-232968

(51) Int. Cl.
| | |
|---|---|
| C23F 1/00 | (2006.01) |
| H01J 37/32 | (2006.01) |
| C23F 1/02 | (2006.01) |
| H01L 21/311 | (2006.01) |
| H01L 21/3213 | (2006.01) |
| C23F 4/00 | (2006.01) |

(52) U.S. Cl.
CPC ............. *H01J 37/32082* (2013.01); *C23F 1/02* (2013.01); *C23F 4/00* (2013.01); *H01L 21/31116* (2013.01); *H01L 21/31122* (2013.01); *H01L 21/31138* (2013.01); *H01L 21/32136* (2013.01); *H01L 21/32139* (2013.01); *H01J 2237/334* (2013.01)

(58) Field of Classification Search
CPC ....... C23F 1/02; C23F 1/12; H01L 21/32136; H01L 21/31116
USPC .......................... 216/67, 75, 78; 438/720, 742
See application file for complete search history.

(56) References Cited

U.S. PATENT DOCUMENTS

| | | | |
|---|---|---|---|
| 6,534,416 B1 * | 3/2003 | Ye et al. | 438/714 |
| 2006/0014394 A1 * | 1/2006 | Kulkarni | 438/710 |

OTHER PUBLICATIONS

Wu et al., "Low-Temperature Etching of Cu by Hydrogen-Based Plasmas" ACS Applied Materials & Interfaces, vol. 2, No. 8, pp. 2175-2179, Jul. 16, 2010.

\* cited by examiner

*Primary Examiner* — Binh X Tran
(74) *Attorney, Agent, or Firm* — Pearne & Gordon LLP

(57) ABSTRACT

A method of etching a copper layer of a target object including, on the copper layer, a mask having a pattern to be transferred onto the copper layer is provided. The method includes etching the copper layer by using plasma of a first gas containing a hydrogen gas; and processing the target object by using plasma of a second gas containing a hydrogen gas and a gas (hereinafter, referred to as "deposition gas") that is deposited on the target object. Further, the etching of the copper layer by using plasma of the first gas and the processing of the target object by using plasma of the second gas are repeated alternately.

3 Claims, 12 Drawing Sheets

FIG. 9

TABLE 1

| BLOCK | NUMBER OF CYCLES | PRESSURE (mTorr/Pa) | HF (W) | LF (W) | H₂ (sccm) | Ar (sccm) | CH₄ (sccm) | O₂ (sccm) | CF₄ (sccm) | Cl₂ (sccm) | C₄F₈ (sccm) | SiCl₄ (sccm) | PROCESSING TIME (SEC) |
|---|---|---|---|---|---|---|---|---|---|---|---|---|---|
| S1b | 1 | 50/6.666 | 300 | 50 | | | | | 100 | | | | 22 |
| S1c | 1 | 10/1.333 | 200 | 500 | | | | 200 | | | | 3 | 15 |
| S2a | 1 | 20/2.666 | 150 | 300 | | 800 | | 15 | | | 30 | | 15 |
| S2b | 1 | 100/13.33 | 600 | 0 | | | | 600 | | | | | 30 |
| S3 | 10 | 10/1.333 | 500 | 300 | 100 | 400 | | | | | | | 10 |
| S4 | | 10/1.333 | 500 | 300 | 400 | | 100 | | | | | | 5 |
| S6 | 1 | 10/1.333 | 500 | 300 | 100 | 400 | | | | | | | 10 |
| S7 | 1 | 100/13.33 | 600 | 0 | | | | 600 | | | | | 30 |

FIG. 11

TABLE 2

| BLOCK | NUMBER OF CYCLES | PRESSURE (mTorr/Pa) | HF (W) | LF (W) | H₂ (sccm) | Ar (sccm) | CH₄ (sccm) | O₂ (sccm) | CF₄ (sccm) | Cl₂ (sccm) | C₄F₈ (sccm) | SiCl₄ (sccm) | PROCESSING TIME (SEC) |
|---|---|---|---|---|---|---|---|---|---|---|---|---|---|
| S1b | 1 | 50/6.666 | 300 | 50 | | | | | | | | | 22 |
| S1c | 1 | 10/1.333 | 200 | 500 | | | | 200 | 100 | | | 3 | 15 |
| S20a | 1 | 10/1.333 | 250 | 200 | | 400 | | | | 60 | | | 35 |
| S20b | 1 | 100/13.33 | 500 | 0 | | | | 750 | | | | | 60 |
| S20c | 1 | 40/5.333 | 200 | 50 | | 800 | | 15 | | | 30 | | 15 |
| S3 | 6 | 10/1.333 | 500 | 300 | 400 | 100 | | | | | | | 5 |
| S4 | 1 | 10/1.333 | 500 | 300 | 400 | | 100 | | | | | | 15 |
| S6 | 1 | 10/1.333 | 500 | 300 | 400 | 100 | | | | | | | 10 |
| S7 | 1 | 100/13.33 | 500 | 0 | | | | 750 | | | | | 60 |

METHOD OF ETCHING COPPER LAYER AND MASK

CROSS-REFERENCE TO RELATED APPLICATION

This application claims the benefit of Japanese Patent Application No. 2012-232968 filed on Oct. 22, 2012, and U.S. Provisional Application Ser. No. 61/720,978 filed on Oct. 31, 2012, the disclosures of which are incorporated herein by reference.

TECHNICAL FIELD

The embodiments described herein pertain generally to a method of etching a copper layer and a mask which can be employed for etching a copper layer.

BACKGROUND

In manufacturing a semiconductor device, a process for forming a wiring such as an interconnection line or contact is carried out. Conventionally, as such a process, a damascene process has been used. In the damascene process, a groove or a hole is formed at an interlayer insulating film by etching, and a metal material is buried in the formed groove or hole. However, along with a recent trend of miniaturization of wiring, the damascene process is accompanied by various problems such as difficulty in burying a metal material in a fine hole or groove.

In order to solve the above-described problem of the damascene process, there has been suggested a process in which a copper layer is formed first and a fine copper wiring is formed by etching the copper layer. Such a process is described in Non-Patent Document 1. In the process described in Non-Patent Document 1, a copper layer is etched by exposing the copper layer to plasma of a processing gas containing a hydrogen gas and an argon gas.

Non-Patent Document 1: Fangyu Wu et al., "Low-Temperature Etching of Cu by Hydrogen-Based Plasmas", ACS APPLIED MATERIALS & INTERFACES, 2010, Vol. 2, No. 8, p. 2175-2179

SUMMARY

However, in an etching process by using plasma of a processing gas containing a hydrogen gas and an argon gas, verticality of a side wall of a copper wiring cannot be assured.

Therefore, it is required to improve the verticality of a side wall of a copper wiring formed by etching a copper layer in the present technical field.

In view of the foregoing problems, example embodiments provide a method of etching a copper layer of a target object including, on the copper layer, a first mask having a pattern to be transferred onto the copper layer. The method includes etching the copper layer by using plasma of a first gas containing a hydrogen gas; and processing the target object by using plasma of a second gas containing a hydrogen gas and a gas (hereinafter, referred to as "deposition gas") that is deposited on the target object. Further, the etching of the copper layer by using plasma of the first gas and the processing of the target object by using plasma of the second gas are repeated alternately. In the example embodiment, the deposition gas is a gas containing carbon, for example, a methane gas.

In the above-described method, etching of the copper layer by using plasma of the first gas and forming of a protective film deposited by the deposition gas on a surface of the target object by using plasma of the second gas are repeated alternately. According to the present method, since the protective film is deposited on the first mask, it is possible to suppress edge portions of the first mask from being excessively removed. As a result, verticality of a side wall of a copper wiring can be improved. Further, it is possible to protect a base of the copper layer by using the protective film. Furthermore, since the second gas contains the hydrogen gas together with the deposition gas, it is possible to suppress the protective film from being excessively deposited.

In the example embodiment, the method may further include forming the pattern of the first mask by etching a stacked body having a first layer that is made of silicon nitride or silicon oxide and is formed on the copper layer and a second layer that is made of TiN and is formed on the first layer. Here, the forming of the pattern of the first mask may include etching the second layer by using plasma of a chlorine-containing gas; and etching the first layer by using plasma of a fluorocarbon-based gas.

The copper layer can be selectively etched with respect to the second layer made of TiN by plasma of the first gas containing the hydrogen gas. That is, while the copper layer is etched by plasma of the first gas, the second layer made of TiN is not substantially etched. Meanwhile, the second layer made of TiN is etched by plasma of the chlorine-containing gas, and the copper layer is corroded by the plasma of the chlorine-containing gas. In the present example embodiment, however, the first layer made of silicon nitride or silicon oxide, which is not substantially affected by corrosion caused by plasma of the chlorine gas, is formed under the second layer made of TiN, and the copper layer is etched with plasma of the hydrogen gas by using the first mask formed of the first layer and the second layer. Therefore, it is possible to suppress the copper layer from being corroded when the first mask is formed and also possible to improve etching selectivity for the copper layer with respect to the first mask when the copper layer is etched.

In other example embodiment, a second mask containing carbon may be formed on the second layer of the first mask, and the forming of the first mask further includes removing the second mask by exposing the second mask into plasma of an oxygen-containing gas between the etching of the second layer by using plasma of the chlorine-containing gas and the etching of the first layer by using plasma of the fluorocarbon-based gas. According to this example embodiment, after the first layer is etched, the second mask is removed. Thus, it is possible to suppress a deposit based on carbon from being left after the first mask for etching the copper layer is formed.

In still another example embodiment, a mask used for etching a copper layer includes a first mask portion formed from a first layer that is made of silicon nitride or silicon oxide and is formed on the copper layer; and a second mask portion formed from a second layer that is made of TiN and is formed on the first layer. The mask can improve the verticality of a side wall of a copper wiring as described above and selectively etch the copper layer.

As explained above, according to the example embodiments, the verticality of a side wall of a copper wiring formed by etching a copper layer can be improved.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items:

FIG. 9 provides a table showing conditions of Experimental Example 1;

FIG. 11 provides a table showing conditions of Experimental Example 2; and

DETAILED DESCRIPTION

Figure 1:
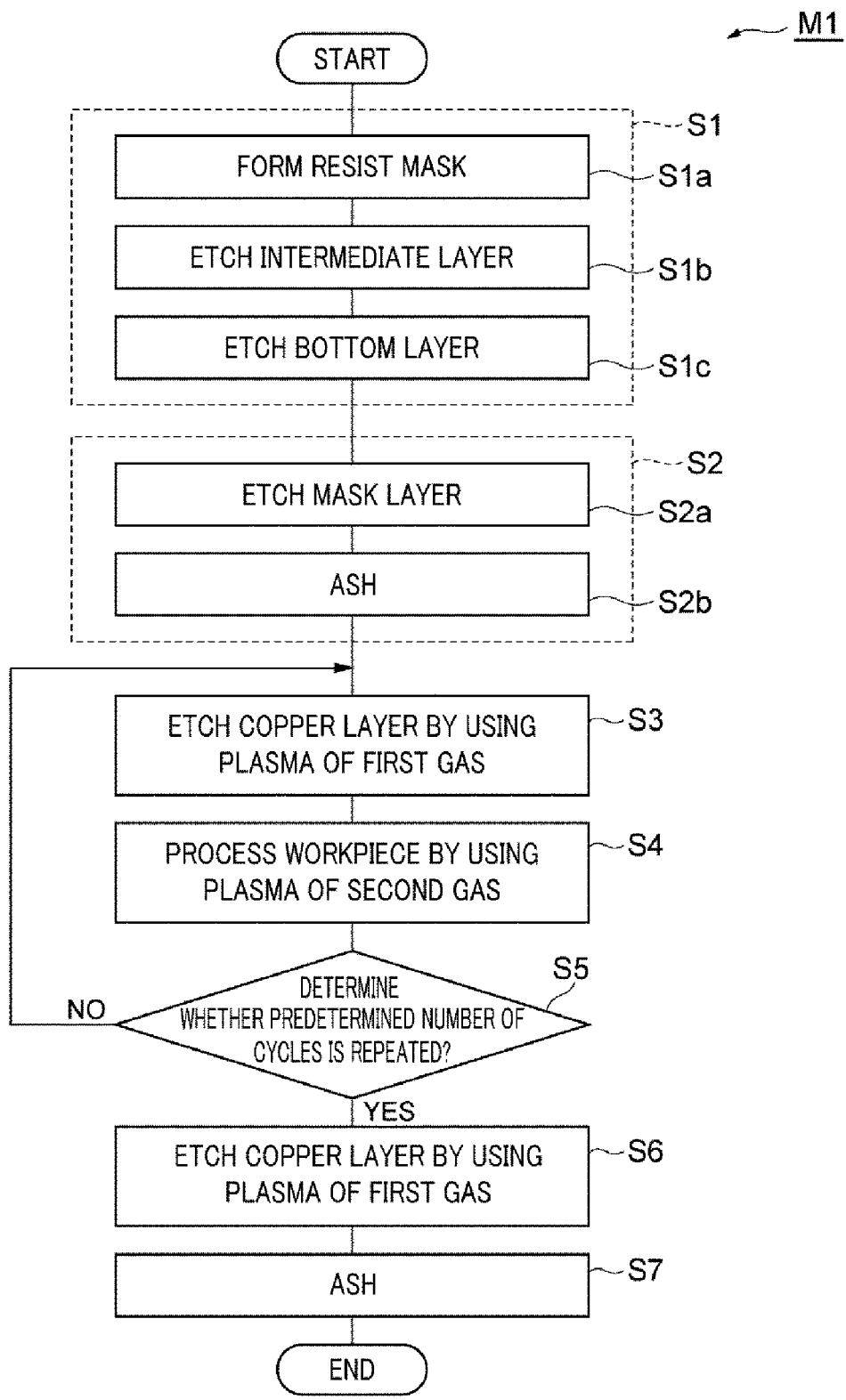
FIG. 1 is a flow chart showing a method M1 of etching a copper layer in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flow chart showing a method of etching a copper layer in accordance with an example embodiment. In a method M1 shown in FIG. 1, at block S3 (etch copper layer by using plasma of first gas), a copper layer is etched by using plasma of a first gas containing a hydrogen gas, and at block S4 (process workpiece by using plasma of second gas), a workpiece is processed by using plasma of a second gas containing a hydrogen gas and a gas (hereinafter, referred to as "deposition gas"), which can be deposited on the workpiece including the copper layer. Block S3 and block S4 are repeated alternately.

Figure 2:
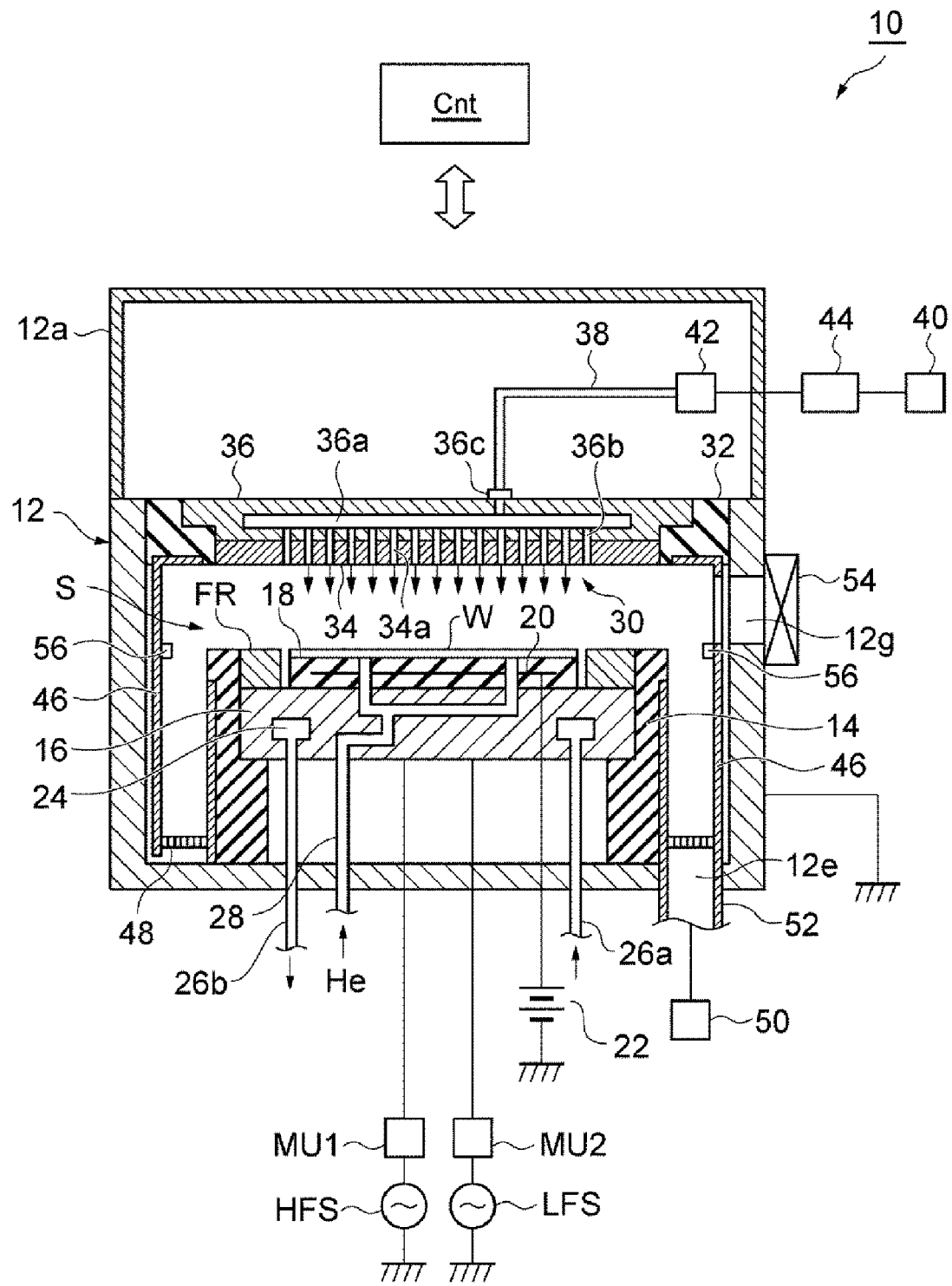
FIG. 2 is a schematic view of a plasma processing apparatus in accordance with the example embodiment.

Hereinafter, a plasma processing apparatus which can be used in the example embodiment of the method M1 as shown in FIG. 1 will be explained. FIG. 2 is a schematic view of a plasma processing apparatus in accordance with the example embodiment. FIG. 2 schematically illustrates a cross sectional configuration of a plasma processing apparatus 10. The plasma processing apparatus 10 is a capacitively coupled parallel plate type plasma etching apparatus and includes a substantially cylindrical processing chamber 12. A surface of the processing chamber 12 is formed of, for example, anodically oxidized aluminum. The processing chamber 12 is frame grounded.

On a bottom portion of the processing chamber 12, a cylindrical supporting member 14 made of an insulating material is provided. An inner wall surface of the supporting member 14 supports a lower electrode 16. The lower electrode 16 is made of a metal such as aluminum and has a substantially disc shape.

The lower electrode 16 is connected to a first high frequency power supply HFS via a matching unit MU1. The first high frequency power supply HFS is a power supply configured to generate a high frequency power for plasma generation and to generate a high frequency power having a frequency ranging from about 27 MHz to about 100 MHz, for example, about 40 MHz. The matching unit MU1 includes a circuit for matching an output impedance of the first high frequency power HFS with an input impedance of a load side (lower electrode 16's side). The lower electrode 16 is also connected to a second high frequency power supply LFS via a matching unit MU2. The second high frequency power supply LFS is configured to generate a high frequency power (high frequency bias power) for ion attraction onto a wafer W and to apply the high frequency bias power to the lower electrode 16. A frequency of the high frequency bias power ranges from about 400 kHz to about 13.56 MHz, for example, about 3 MHz. The matching unit MU2 includes a circuit for matching an output impedance of the second high frequency power LFS with an input impedance of the load side (lower electrode 16's side).

On the lower electrode 16, an electrostatic chuck 18 is provided. The electrostatic chuck 18 and the lower electrode 16 constitute a mounting table configured to mount thereon a workpiece W (hereinafter, referred to as "wafer W"). The electrostatic chuck 18 has a configuration in which an electrode 20 as a conductive film is arranged between a pair of insulating layers or insulating sheets. The electrode 20 is electrically connected to a DC power supply 22. The electrostatic chuck 18 can attract and hold the wafer W by an electrostatic force such as a Coulomb force generated by a DC voltage from the DC power supply 22.

A focus ring FR is provided on a top surface of the lower electrode 16 around the electrostatic chuck 18. The focus ring FR is provided to improve etching uniformity. The focus ring FR is made of a material appropriately selected depending on a material of an etching target layer and may be made of, for example, silicon or quartz.

Within the lower electrode 16, a coolant path 24 is formed. A coolant, for example, cooling water, which has a predetermined temperature and is supplied from a chiller unit provided outside via lines 26a and 26b, is circulated through the coolant path 24. By controlling a temperature of the coolant circulated as described above, a temperature of the wafer W mounted on the electrostatic chuck 18 can be controlled.

Further, a gas supply line 28 is provided in the plasma processing apparatus 10. The gas supply line 28 is configured to supply a heat transfer gas, for example, a He gas, from a heat transfer gas supply unit toward a gap between a top surface of the electrostatic chuck 18 and a rear surface of the wafer W.

Further, within the processing chamber 12, an upper electrode 30 is provided. The upper electrode 30 is provided above the lower electrode 16 to face the lower electrode 16. The lower electrode 16 and the upper electrode 30 are arranged in substantially parallel with each other. Between the upper electrode 30 and the lower electrode 16, a processing space S for etching the wafer W with plasma is formed.

The upper electrode 30 is supported at a top portion of the processing chamber 12 via an insulating shield member 32. The upper electrode 30 may include an electrode plate 34 and an electrode supporting body 36. The electrode plate 34 faces the processing space S and has multiple gas discharge holes 34a. The electrode plate 34 may be formed of a conductor or a semiconductor having a low resistance and a low Joule heat.

The electrode supporting body 36 is configured to detachably support the electrode plate 34 and may be made of a conductive material such as aluminum. The electrode supporting body 36 may have a water-cooling structure. Within the electrode supporting body 36, a gas diffusion room 36a is formed. Multiple gas through holes 36b communicating with the gas discharge holes 34a are formed downwards from the gas diffusion room 36a. Further, the electrode supporting body 36 includes a gas inlet opening 36c to introduce a processing gas into the gas diffusion room 36a, and the gas inlet opening 36c is connected to a gas supply line 38.

Figure 3:
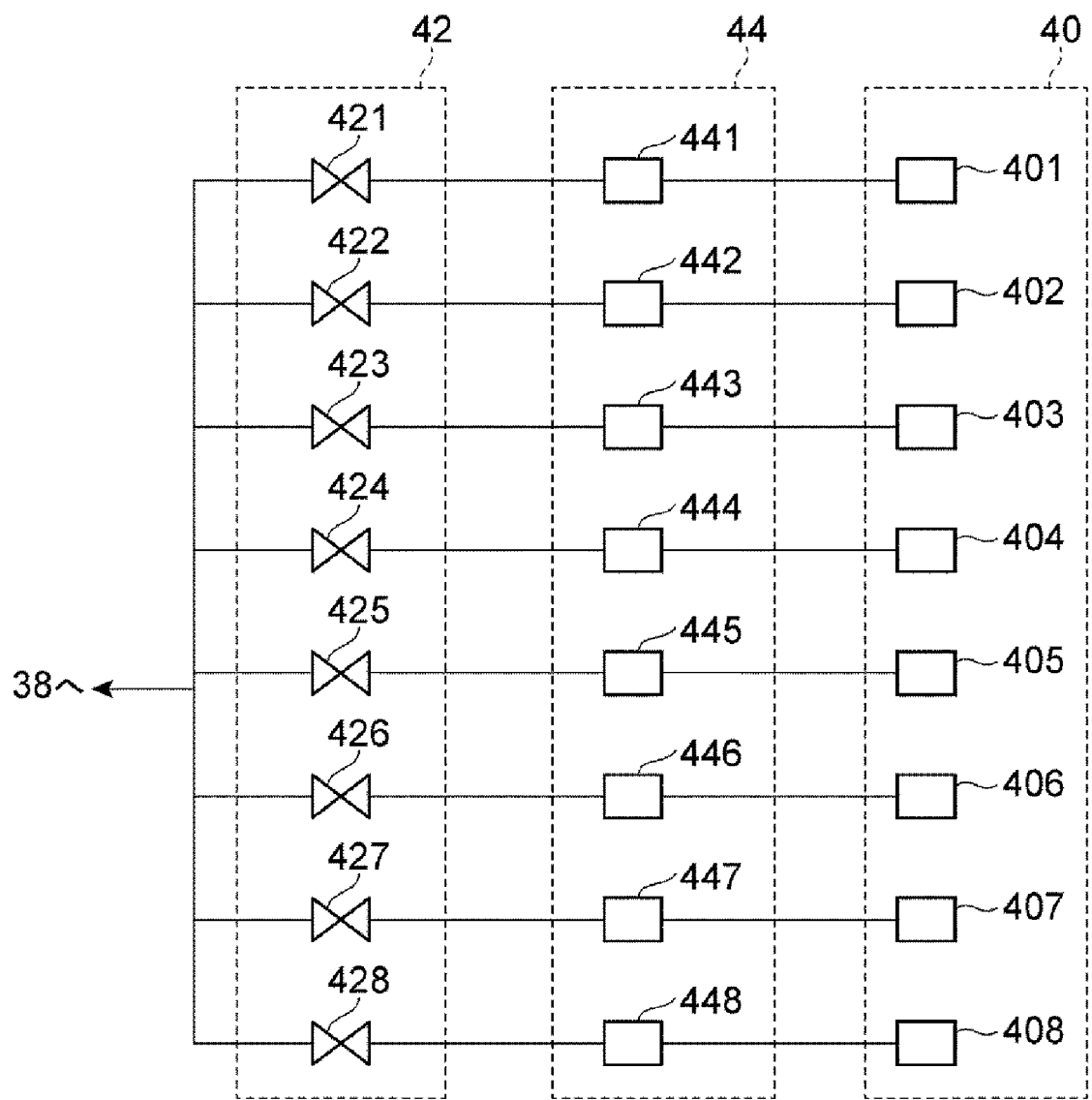
FIG. 3 illustrates an example of a valve group, a flow rate controller group, and a gas source group in detail.

The gas supply line 38 is connected to a gas source group 40 via a valve group 42 and a flow rate controller group 44. FIG. 3 illustrates an example of a valve group, a flow rate controller group, and a gas source group in detail. As illustrated in FIG. 3, the gas source group 40 includes multiple gas sources 401 to 408. The gas sources 401 to 408 are sources of a $H_2$ gas, an Ar gas, a $CH_4$ gas, an $O_2$ gas, a $CF_4$ gas, a $Cl_2$ gas, a $C_4F_8$ gas, and a $SiCl_4$ gas, respectively. The flow rate controller group 44 includes multiple flow rate controllers 441 to 448. The flow rate controllers 441 to 448 are connected to gas sources 401 to 408, respectively. Each of the flow rate controllers 441 to 448 may be a mass flow rate controller. The valve group 42 includes multiple valves 421 to 428. The valves 421 and 428 are connected to the flow rate controllers 441 to 448, respectively.

In the plasma processing apparatus 10, a gas source selected from the gas sources 401 to 408 supplies a gas to the gas supply line 38 at a flow rate controlled by the corresponding flow rate controller and valve. The gas supplied to the gas supply line 38 reaches the gas diffusion room 36a and is discharged into the processing space S through the gas through holes 36b and the gas discharge holes 34a.

Further, the plasma processing apparatus 10 may further include a ground conductor 12a. The ground conductor 12a has a substantially cylindrical shape and is extended upwards to a position higher than a position of the upper electrode 30 from a side wall of the processing chamber 12.

Furthermore, in the plasma processing apparatus 10, a deposit shield 46 is detachably provided along an inner wall of the processing chamber 12. Moreover, the deposit shield 46 is also provided along the periphery of the supporting member 14. The deposit shield 46 is configured to suppress adhesion of an etching by-product (deposit) to the processing chamber 12 and may be formed by coating an aluminum member with ceramics such as $Y_2O_3$ or the like.

At a bottom of the processing chamber 12, an exhaust plate 48 is provided between the supporting member 14 and the inner wall of the processing chamber 12. By way of example, the exhaust plate 48 may be formed by coating an aluminum member with ceramics such as $Y_2O_3$ or the like. At a lower side of the exhaust plate 48 in the processing chamber 12, an exhaust opening 12e is formed. The exhaust opening 12e is connected to an exhaust device 50 via an exhaust line 52. The exhaust device 50 includes a vacuum pump such as a turbo molecular pump or the like and can depressurize the inside of the processing chamber 12 to a desired vacuum level. Further, at a side wall of the processing chamber 12, a transfer opening 12g of the wafer W is formed. The transfer opening 12g is configured to be opened and closed by a gate valve 54.

Furthermore, at the inner wall of the processing chamber 12, a conductive member (GND block) 56 is provided. The conductive member 56 is located at a position substantially equal to the wafer W in a height direction of the apparatus. The conductive member 56 is connected to the ground in a DC manner and is configured to suppress abnormal discharge.

Moreover, the plasma processing apparatus 10 may further include a control unit Cnt. The control unit Cnt may be a computer including a processor, a storage unit, an input device, a display device, and the like and is configured to control respective components of the plasma processing apparatus 10. With the control unit Cnt, an operator can input commands to manage the plasma processing apparatus 10 by using the input device, and display and visualize an operation status of the plasma processing apparatus 10 on the display device. Further, in the storage unit of the control unit Cnt, a control program for controlling various processes performed in the plasma processing apparatus 10 by the processor or a program for performing a process on each component of the plasma processing apparatus 10 according to processing conditions or process recipes are stored.

In the plasma processing apparatus 10, one or more gas sources selected from the gas sources 401 to 408 supply gases into the processing chamber 12 in order to process the wafer W. Then, a high frequency electric field is generated between the lower electrode 16 and the upper electrode 30 by applying the high frequency power for plasma generation to the lower electrode 16. By this high frequency electric field, the gas supplied into the processing space S is excited into plasma. Further, with the generated plasma of the gas, a process such as an etching process on an etching target layer of the wafer W is performed. Furthermore, when the high frequency bias power is applied to the lower electrode 16, ions are attracted to the wafer W. Thus, the etching process to the etching target layer of the wafer W is promoted.

FIG. 1 will be referred to again. Hereinafter, the method M1 which can be performed by using the plasma processing apparatus 10 described above will be explained in more detail with reference to FIG. 1 together with FIG. 4A to FIG. 4E, FIG. 5A to FIG. 5C, and FIG. 6A and FIG. 6B. FIG. 4A to FIG. 6B illustrate cross sections of a part of the wafer W. As shown in FIG. 1, in the method M1, at block S1, a mask MK2 is formed. The mask MK2 is used to form a mask MK1 for etching a copper layer of the wafer W.

Figure 4A:
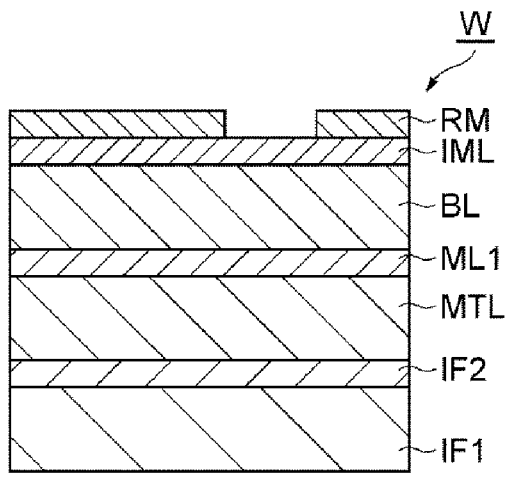
FIG. 4A to FIG. 4E provide diagrams explaining respective processes of the method M1.

Block S1 includes block S1a, block S1b, and block S1c. At block S1a (form resist mask), a resist mask is formed. Herein, as depicted in FIG. 4A, the wafer W includes a first insulating film IF1, a second insulating film IF2, a copper layer MTL, a mask layer ML1, a bottom layer BL, and an intermediate layer IML. The first insulating film IF1 is an interlayer insulating film and may be made of an insulating material such as SiC, SiON, SiCN, or the like. The second insulating film IF2 is formed on the first insulating film IF1 and may be made of, for example, SiC. On the second insulating film IF2, the copper layer MTL is formed. On the copper layer MTL, the mask layer ML1 is formed. The mask layer ML1 serves as a mask MK1 for etching the copper layer MTL and may be made of, for example, silicon nitride or silicon oxide. On the mask layer ML1, the bottom layer BL is formed. The bottom layer BL serves as a mask MK2 for etching the mask layer ML1 and may be made of, for example, amorphous carbon. On the bottom layer BL, the intermediate layer IML is formed. The intermediate layer IML may be SOG (Spin On Glass) or an antireflection film. On the intermediate layer IML, a resist mask RM formed at block S1a is formed. The resist mask RM is formed by performing photolithography technique on a resist material such as an ArF resist.

Figure 4B:
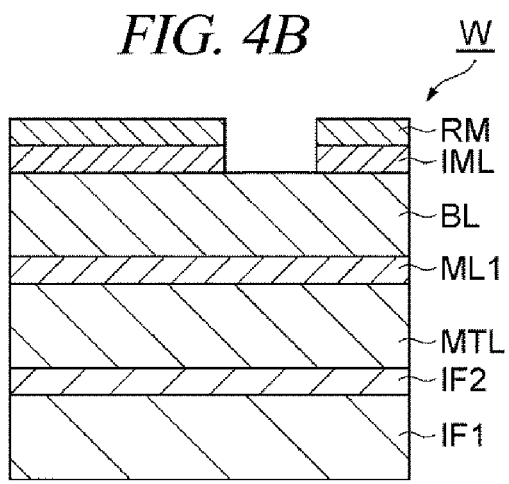

Then, in the method M1, the wafer W depicted in FIG. 4A is mounted on the electrostatic chuck 18 of the plasma processing apparatus 10, and block S1b is performed as shown in FIG. 1. At block S1b (etch intermediate layer), the intermediate layer IML is etched. In etching the intermediate layer IML, plasma of a fluorocarbon-based gas, for example, a $CF_4$ gas supplied from the gas source 405 is generated, and the wafer W is exposed to this plasma. At block S1b, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the intermediate layer IML can be etched. Further, at block S1b, other gases such as an inert gas may be supplied together with the fluorocarbon-based gas. Through block S1b, as depicted in FIG. 4B, a pattern of the resist mask RM is transferred onto the intermediate layer IML.

Figure 4C:
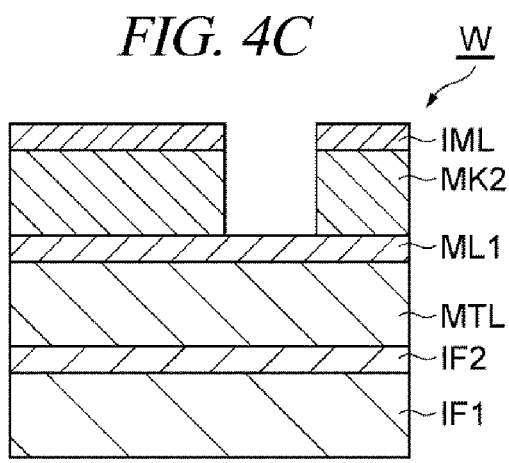

Then, in the method M1, as shown in FIG. 1, at block S1c (etch bottom layer), the bottom layer BL is etched. In etching the bottom layer BL, plasma of an $O_2$ gas supplied from the gas source 404 is generated, and the wafer W depicted in FIG. 4B is exposed to this plasma. Further, at block S1c, a $SiCl_4$ gas may be supplied from the gas source 408 into the processing chamber 12. At block S1c, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the bottom layer BL can be etched. Through block S1c, as depicted in FIG. 4C, a pattern of the intermediate layer IML is transferred onto the bottom layer BL, and the mask MK2 formed as the bottom layer BL is formed. Furthermore, at block S1c, since the plasma of the oxygen gas is used, the resist mask RM can be removed.

Figure 4D:
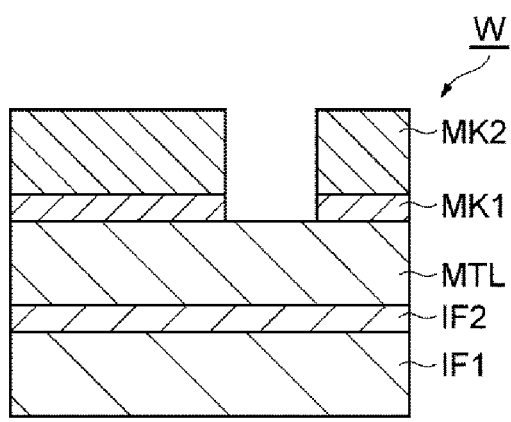

Thereafter, in the method M1, as shown in FIG. 1, at block S2, the mask MK1 is formed. Block S2 includes block S2a and block S2b. At block S2a (etch mask layer), the mask layer ML1 is etched. In etching the mask layer ML1, plasma of a fluorocarbon-based gas, for example, a $C_4F_8$ gas supplied from the gas source 407 is generated, and the wafer W depicted in FIG. 4C is exposed to this plasma. Further, at block S2a, an $O_2$ gas and an Ar gas may be supplied from the gas source 404 and the gas source 402, respectively, into the processing chamber 12. At block S2a, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the mask layer ML1 can be etched. Through block S2a, as depicted in FIG. 4D, a pattern of the mask MK2 is transferred onto the mask layer ML1, and the mask MK1 formed as the mask layer ML1 is formed.

Figure 4E:
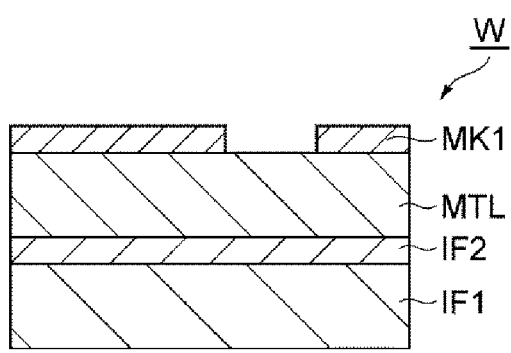

Subsequently, in the method M1, as shown in FIG. 1, at block S2b (ash), an ashing process is performed, and the mask MK2 is removed. During the ashing process, plasma of an $O_2$ gas supplied from the gas source 404 is generated, and the wafer as depicted in FIG. 4D is exposed to this plasma. At block S2b, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the mask MK2 can be removed. Through block S2b, the wafer W becomes in a state as depicted in FIG. 4E.

Figure 5A:
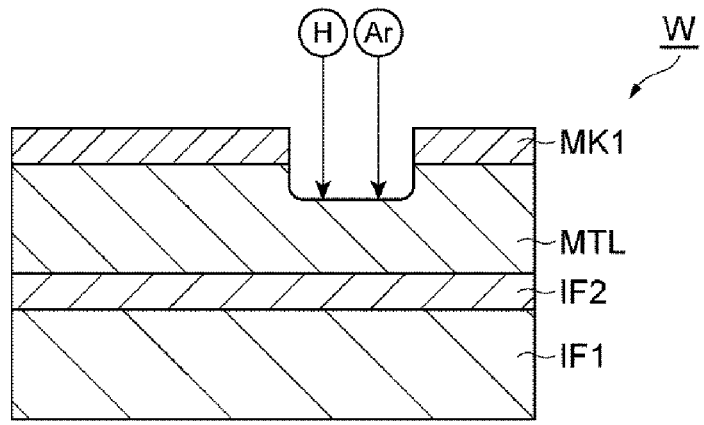
FIG. 5A to FIG. 5C provide diagrams explaining respective processes of the method M1.

Then, in the method M1, as shown in FIG. 1, etching a copper layer by using plasma of the first gas (block S3) and processing the wafer W by using plasma of the second gas (block S4) are repeated alternately. At block S3, a $H_2$ gas supplied from the gas source 401 is contained in the first gas to be supplied into the processing chamber 12. Then, plasma of the first gas is generated. Further, the first gas may contain an Ar gas supplied from the gas source 401. At block S3, as depicted in FIG. 5A, the copper layer MTL is etched with hydrogen ions. If the first gas contains the Ar gas, the copper layer MTL may be also etched with Ar ions. In particular, if the high frequency bias power is applied to the lower electrode 16, the hydrogen ions and the Ar ions are attracted onto the copper layer MTL to be collided with a surface of the copper layer MTL. Such a so-called sputtering effect promotes the etching of the copper layer MTL. In FIG. 5A to FIG. 5C and FIG. 6A to FIG. 6B, a circled "H" represents a hydrogen ion and a circled "Ar" represents an Ar ion.

Figure 5B:
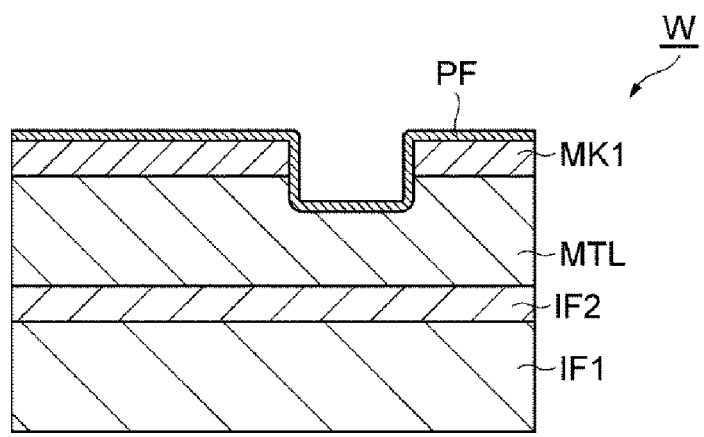

At block S4, the second gas containing a $H_2$ gas and a deposition gas is supplied into the processing chamber 12. In one example embodiment, the deposition gas is a gas containing carbon, for example, a methane ($CH_4$) gas. Besides, as the deposition gas, a $C_4F_6$ gas, a $C_4F_8$ gas, and the like may be used. If a methane gas is used as the deposition gas, the second gas containing the $H_2$ gas and the $CH_4$ gas is supplied from the gas source 401 and the gas source 403, respectively, into the processing chamber 12. Then, plasma of the second gas is generated. At block S4, as depicted in FIG. 5B, a film PF deposited by the deposition gas is formed on a surface of the wafer W. If the deposition gas is a methane gas, a film deposited by the methane gas is formed on the surface of the wafer W. The film PF contains carbon and may be made of, for example, polyethylene.

Figure 5C:
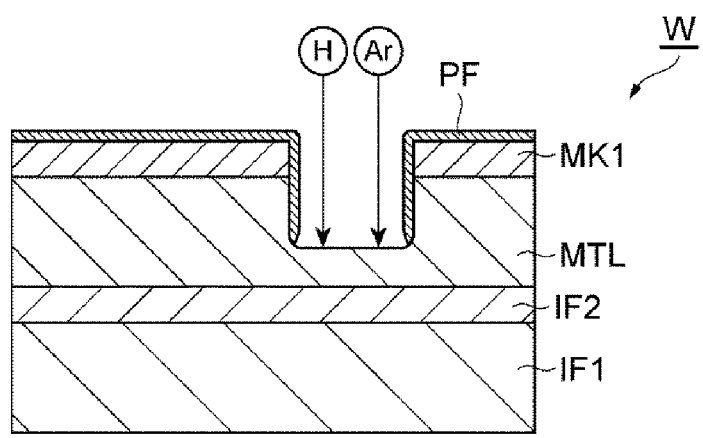
Figure 6A:
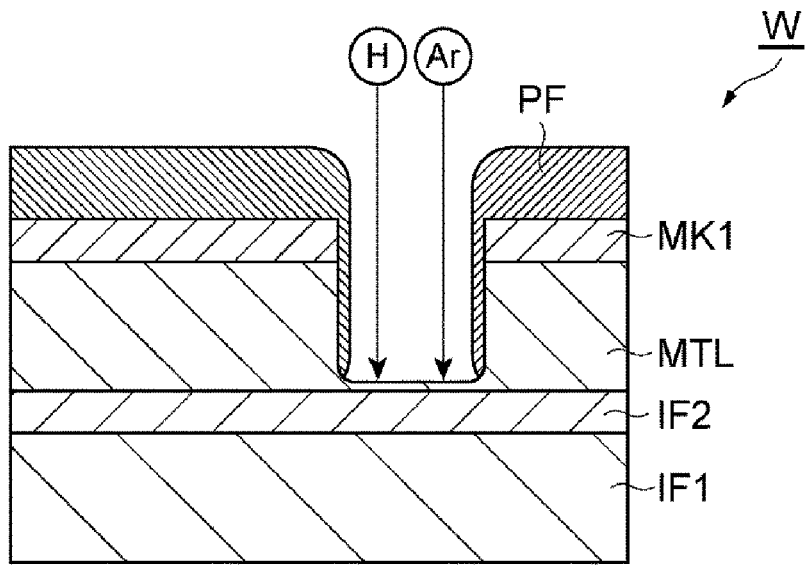
FIG. 6A and FIG. 6B provide diagrams explaining respective processes of the method M1.

In the method M1, by further performing block S3, the copper layer MTL is further etched as depicted in FIG. 5C, and then, block S4 is further performed. In the method M1, as shown in FIG. 1, at block S5 (determine whether predetermined number of cycles is repeated), it is determined whether a predetermined number of cycles of block S3 and block 4 is repeated. If a repeated count of block S3 and block S4 does not reach the predetermined number of cycles, block S3 and block S4 are further performed. Meanwhile, if a repeated count of block S3 and block S4 reaches the predetermined number of cycles, at block S6 (etch copper layer by using plasma of first gas) is performed. Block S6 is performed in the same manner as block S3. Through block S6, as depicted in FIG. 6A, the copper layer MTL is further etched.

Figure 6B:
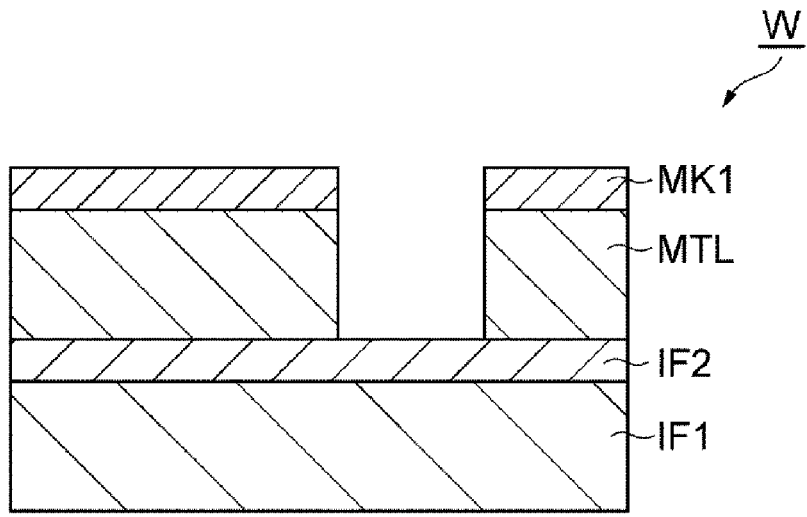

Then, in the method M1, at block S7 (ash), an ashing process for removing the film PF is performed. During the ashing process, plasma of an $O_2$ gas supplied from the gas source 404 is generated, and the wafer W is exposed to this plasma. Through block S7, the wafer W becomes in a state as depicted in FIG. 6B. Thus, a copper wiring is formed from the copper layer MTL.

At block S3, block S4, and block S6, the pressure within the processing chamber 12 may be set to be a low pressure in a range of, for example, from about 5 mTorr to about 20 mTorr (from about 0.666 Pa to about 2.666 Pa). Further, at block S3, block S4, and block S6, the high frequency power from the high frequency power supply HFS and the high frequency bias power from the high frequency power supply LFS may be set to be in a range of, for example, from about 200 W to about 1000 W. Furthermore, a processing time for each of block S3, block S4, and block S6 may be set depending on a thickness of the film PF, i.e., an amount of a deposit, and may be set to be in a range of, for example, from about 5 seconds to about 15 seconds. Moreover, a processing time for block S7 may be set depending on a thickness of the film PF, i.e., an amount of a deposit, and may be set to be in a range of, for example, from about 10 seconds to about 60 seconds. Further, the number of cycles of block S3 and block S4 may be set depending on a thickness of the copper layer MTL or the processing times thereof and may be controlled to etch the copper layer MTL until a base layer of the copper layer MTL is exposed. Furthermore, a flow rate of the hydrogen gas and a flow rate of the argon gas at block S3 and a flow rate of the hydrogen gas and a flow rate of the deposition gas, for example, a methane gas, at block S4 can be adjusted depending on a desired result and may be adjusted to be in a range of, for example, from about 100 sccm to about 600 sccm.

In the method M1 as explained above, since the film PF is deposited on a surface of the mask MK1, the film PF may protect the mask MK1 during the etching process at block S3. Therefore, it is possible to suppress the mask MK1, particularly, edge portions of the mask MK1, from being excessively removed. As a result, verticality of a side wall of the copper wiring formed by the method M1 can be improved. Further, since the base layer of the copper layer MTL is protected by the film PF, damage to the second insulating film IF2 at block S3 can be suppressed. Furthermore, since the second gas contains the $H_2$ gas together with the deposition gas, it is possible to suppress excessive deposition of the film PF by relatively adjusting a flow rate of the deposition gas and a flow rate of the $H_2$ gas.

Figure 7:
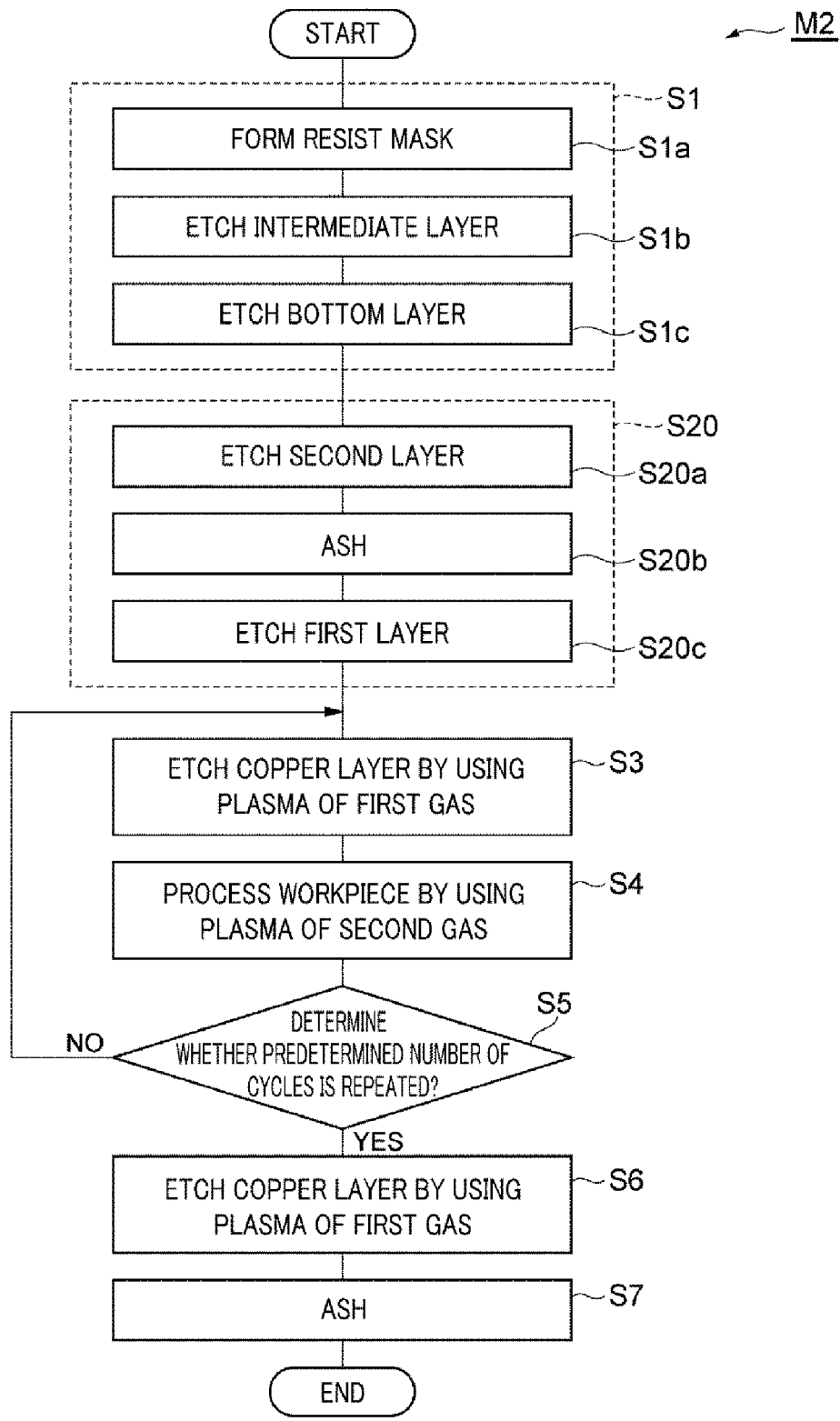
FIG. 7 is a flow chart showing a method (M2) of etching a copper layer in accordance with another example embodiment.

Hereinafter, a method of etching a copper layer in accordance with another example embodiment will be explained. FIG. 7 is a flow chart showing a method of etching a copper layer in accordance with another example embodiment. A method M2 shown in FIG. 7 can also be performed by using the plasma processing apparatus 10. The method M2 is different from the method M1 in that the method M2 includes block S20 instated of block S2 of the method M1. Hereinafter, block S20 of the method M2 will be explained with reference to FIG. 7 and FIG. 8A to FIG. 8F. Further, among the blocks of the method M2, explanations of the same blocks corresponding to those of the method M1 will be omitted.

Referring to FIG. 8A to FIG. 8F, a wafer W to which the method M2 is applied will be explained. As for the wafer W depicted in FIG. 8A, a second layer ML2 is formed on the mask layer (first layer) ML1. That is, the second layer ML2 is formed between the first layer ML1 and the bottom layer BL. As described above, the first layer ML1 is made of, for example, silicon nitride or silicon oxide. The second layer ML2 is made of TiN. Further, as for the wafer W depicted in FIG. 8A, the copper layer MTL is formed right on the insulating film IF1. However, the insulating film under the copper layer MTL has a configuration in the same manner as depicted in FIG. 4A.

Figure 8A:
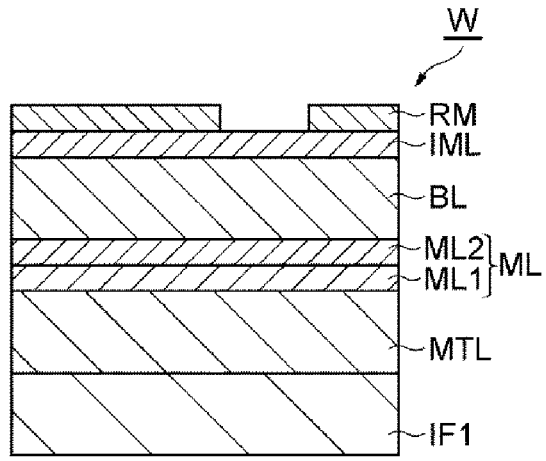
FIG. 8A to FIG. 8F provide diagrams explaining respective processes of the method M2.
Figure 8D:
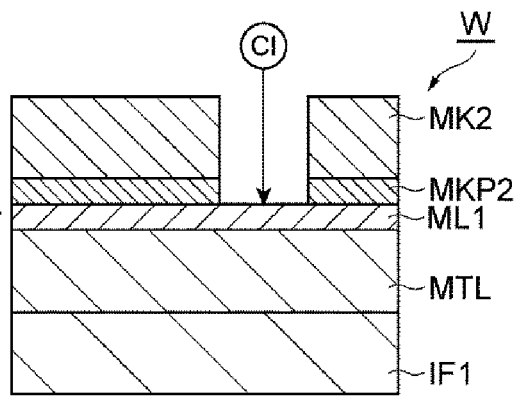
Figure 8B:
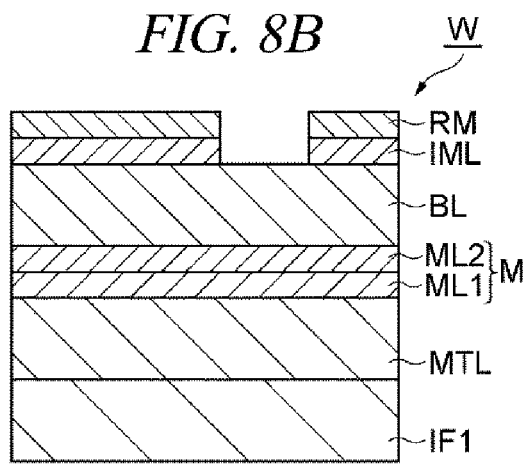
Figure 8E:
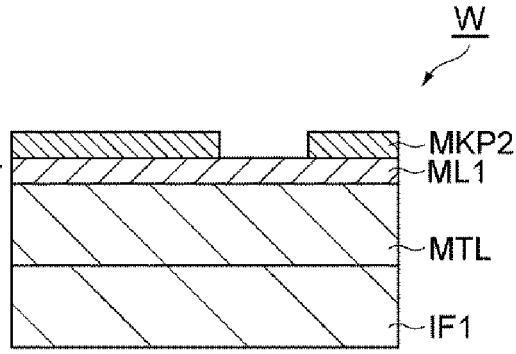
Figure 8C:
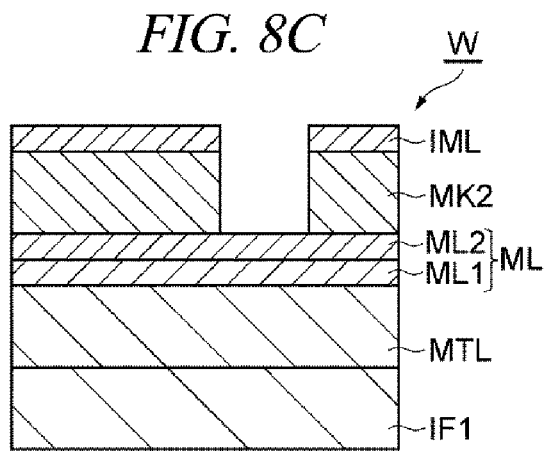

In the method M2, a mask used for etching the copper layer is formed from a stacked body ML of the first layer ML1 and the second layer ML2. Block S1 performed prior to block S20, at which a mask is formed, is carried out in the same manner as block S1 of the method M1 as depicted in FIG. 8A to FIG. 8C.

Block S20 of the method M2 includes block S20a, block S20b, and block S20c. At block S20a (etch second layer), the second layer ML2 is etched. In etching the second layer ML2, plasma of a chlorine-containing gas, for example, a $Cl_2$ gas supplied from the gas source 406 is generated, and the wafer W depicted in FIG. 8C is exposed to this plasma. Further, at block S20a, an Ar gas from the gas source 402 may be also supplied into the processing chamber 12. At block S20a, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the second layer ML2 can be etched. At block S20a, as depicted in FIG. 8D, the second layer ML2 made of TiN is etched with active species of chlorine such as chlorine ions, and a pattern of the mask MK2 is transferred onto the second layer ML2. Thus, a second mask portion MKP2 is formed from the second layer ML2. Further, as depicted in FIG. 8D, a circled "Cl" represents the active species of chlorine.

Then, in the method M2, at block S20b (ash), the mask MK2 is removed by an ashing process. During the ashing process at block S20b, plasma of an $O_2$ gas supplied from the gas source 404 is generated, and the wafer depicted in FIG. 8D is exposed to this plasma. Through block S20b, the wafer W becomes in a state as depicted in FIG. 8E. Further, at block S20b, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the mask MK2 can be removed.

Figure 8F:
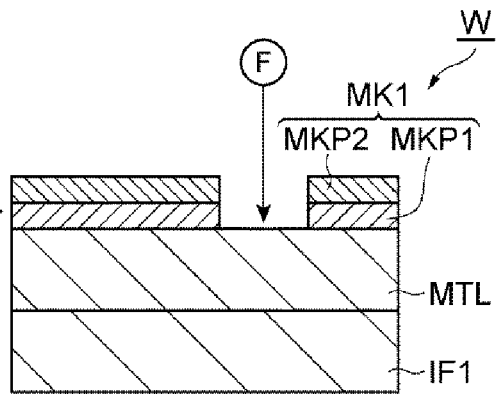

Thereafter, in the method M2, at block S20c (etch first layer), the first layer ML1 is etched. During the etching process of the first layer at block S20c, plasma of a fluorocarbon-based gas, for example, a $C_4F_8$ gas supplied from the gas source 407 is generated, and the wafer W depicted in FIG. 8E is exposed to this plasma. Herein, the term "fluorocarbon-based gas" means fluorocarbon and fluoro-hydrocarbon. At block S20c, as depicted in FIG. 8F, the first layer ML1 is etched with active species of fluorine (represented by a circled "F" in FIG. 8F) such as fluorine ions. Further, at block S20c, an $O_2$ gas and an Ar gas may be supplied from the gas source 404 and the gas source 402, respectively, into the processing chamber 12. At block S20c, a pressure within the processing chamber 12, a high frequency power from the high frequency power supply HFS and the frequency thereof, a high frequency bias power from the high frequency power supply LFS and the frequency thereof, and a flow rate of the gas may have certain values as long as the first layer ML1 can be etched. Through block S20c, a pattern of the second mask portion MKP2 is transferred onto the first layer ML1. Thus, a first mask portion MKP1 formed as the first layer ML1 is formed, and the mask MK1 including the first mask portion MKP1 and the second mask portion MKP2 is formed.

TiN forming the second layer ML2 can be etched with chlorine, and chlorine may corrode the copper layer MTL. In the method M2, since the first layer ML1 made of silicon nitride or silicon oxide, which is not substantially affected by corrosion caused by chlorine, is interposed between the second layer ML2 and the copper layer MTL, by etching the second layer ML2 with chlorine, corrosion of the copper layer MTL can be suppressed. Further, TiN forming the second layer ML2 is not substantially etched with hydrogen ions. Therefore, since the mask MK1 including the second mask portion MKP2 formed as the second layer ML2 has excellent etching resistance to the copper layer MTL, the mask MK1 can be maintained until the etching of the copper layer MTL is finished. That is, during the etching of the copper layer MTL with the first gas, the copper layer MTL can be selectively etched with respect to the mask MK1. Therefore, by etching the copper layer MTL with the mask MK1, verticality of a side wall of a copper wiring formed from the copper layer MTL can be improved.

Further, in the method M2, the mask MK2 is removed after the second layer ML2 is etched and before the first layer ML1 is etched. Thus, it is possible to suppress a deposit based on carbon from being left after the mask MK1 for etching the copper layer MTL is formed.

Hereinafter, Experimental Examples using various methods of the above-described example embodiments will be explained.

Experimental Example 1 and Comparative Experimental Example 1

In Experimental Example 1, the method M1 is performed by using the plasma processing apparatus 10. In Experimental Example 1, the wafer W depicted in FIG. 4A is used as a wafer W. In the wafer W, the second insulating film IF2 is a SiC layer having a thickness of about 5 nm, and the copper layer MTL has a thickness of about 35 nm. Further the mask layer ML1 is a SiN layer having a thickness of about 10 nm, and the bottom layer BL is an amorphous carbon layer having a thickness of about 80 nm. Furthermore, the intermediate layer IML is a SOG film having a thickness of about 13.5 nm, and the resist mask RM is formed from an ArF resist.

FIG. 9 provides Table 1 showing conditions of Experimental Example 1. In Experimental Example 1, as shown in Table 1, block S3 and block S4 are alternately repeated 10 cycles. Meanwhile, Comparative Experimental Example 1 is performed on the same wafer W by using the plasma processing apparatus 10. To be specific, conditions of Comparative Experimental Example 1 are different from those of Experimental Example 1 in that in Comparative Experimental Example 1, block S4 is not performed and block S3 is continuously performed for about 100 seconds. Further, in Table 1, "HF" represents a high frequency power having a frequency of about 40 MHz and is generated by the high frequency power supply HFS, and "LF" represents a high frequency bias power having a frequency of about 3 MHz and is generated by the high frequency power supply LFS.

Figure 10A:
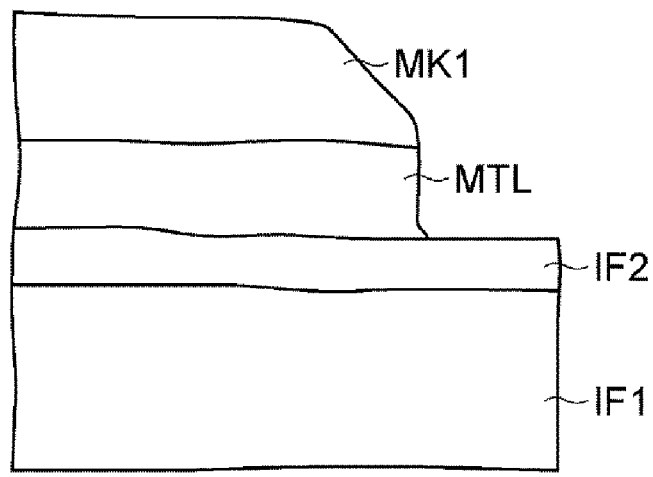
FIG. 10A and FIG. 10B illustrate states of cross sections of wafers W processed in Experimental Example 1 and Comparative Experimental Example 1, respectively.
Figure 10B:
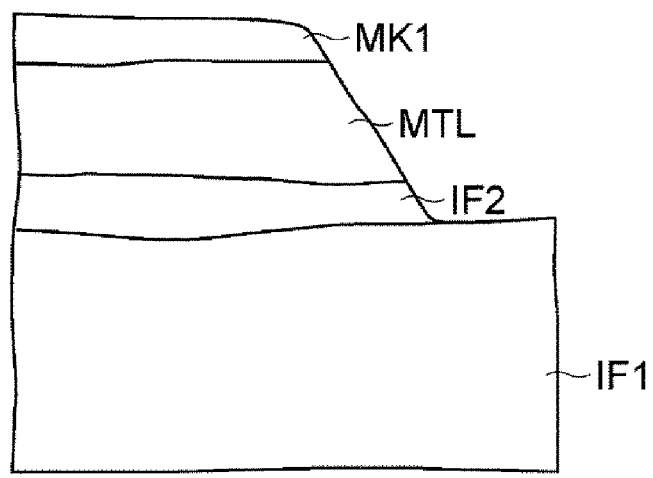

SEM images of cross sections of the wafers W processed in Experimental Example 1 and Comparative Experimental Example 1, respectively, are obtained, and a state of cross sections of copper wirings formed from copper layers MTL is observed. FIG. 10A illustrates a state of a cross section of the wafer W processed in Experimental Example 1 as a result of observation from a SEM image, and FIG. 10B illustrates a state of a cross section of the wafer W processed in Comparative Experimental Example 1 as a result of observation of a SEM image. As illustrated in FIG. 10B, in the wafer W processed by Comparative Experimental Example 1, i.e., processes in which the copper layer MTL is etched without performing block S4, a thickness of the mask MK1 is greatly reduced and edge portions of the mask MK1 are removed. Further, in the wafer W processed by Comparative Experimental Example 1, a side wall of a copper wiring formed from the copper layer MTL is greatly inclined. Furthermore, in the wafer W processed by Comparative Experimental Example 1, the insulating film IF2 is also etched. Meanwhile, as illustrated in FIG. 10A, in the wafer W processed by Experimental Example 1, a thickness of the mask MK1 is maintained and edge portions of the mask MK1 are less removed. Further, in the wafer W processed by Experimental Example 1, a side wall of a copper wiring formed from the copper layer MTL is substantially vertical. Furthermore, in the wafer W processed by Experimental Example 1, damage to the insulating film IF2 is substantially suppressed.

Experimental Example 2

In Experimental Example 2, the method M2 is performed by using the plasma processing apparatus 10. In Experimental Example 2, the wafer W depicted in FIG. 8A is used as a wafer W. In the wafer W, the insulating film IF1 has a thickness of about 40 nm, and the copper layer MTL has a thickness of about 35 nm. Further, the first mask layer ML1 is a SiN layer having a thickness of about 10 nm, and the second layer ML2 is a TiN layer having a thickness of about 20 nm. Furthermore, the bottom layer BL is an amorphous carbon layer having a thickness of about 80 nm, and the intermediate layer IML is a SOG film having a thickness of about 13.5 nm. The resist mask RM is formed from an ArF resist. FIG. 11 provides Table 2 showing conditions of Experimental Example 2. In Experimental Example 2, as shown in Table 2, block S3 and block S4 are alternately repeated 6 cycles. Further, Table 2 is described in the same manner as Table 1.

Figure 12:
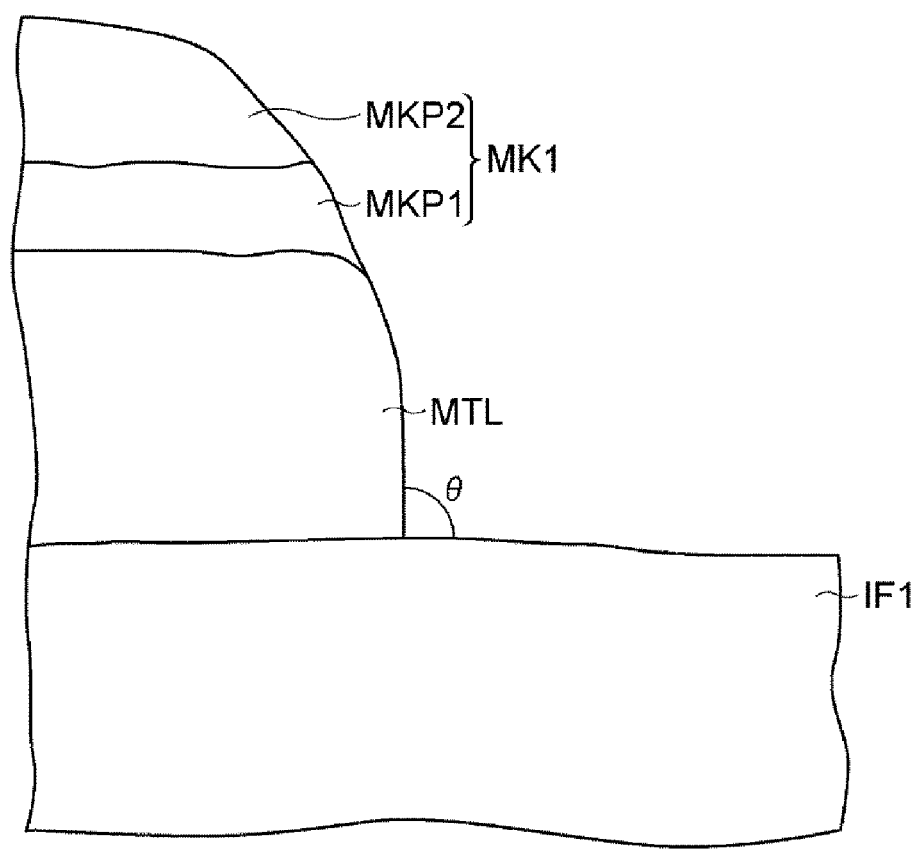
FIG. 12 illustrates a state of a cross section of a wafer W processed in Experimental Example 2.

A SEM image of a cross section of the wafer W processed by Experimental Example 2 is obtained, and a state of a cross section of a copper wiring formed from the copper layer MTL is observed. FIG. 12 illustrates a state of a cross section of the wafer W processed by Experimental Example 2 as a result of observation from a SEM image. As illustrated in FIG. 12, in the wafer W processed by Experimental Example 2, a thickness of the mask MK1 is maintained. Further, an angle (θ) of a side wall of the copper wiring with respect to a horizontal plane is measured as about 89.76 degrees. According to the method M2, it is confirmed that the side wall of the copper wiring formed from the copper layer MTL is substantially vertical. Furthermore, in the wafer W processed by Experimental Example 2, damage to the insulating film IF1 is substantially suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. By way of example, a plasma processing apparatus used in the method M1 and the method M2 is not limited to the plasma processing apparatus 10 described above. In order to perform the method M1 and the method M2, it may be possible to use a plasma processing apparatus in which a high frequency power for plasma generation is supplied to an upper electrode and a high frequency bias power is supplied to a lower electrode. Further, in addition to a parallel plate type plasma processing apparatus, an inductively coupled plasma processing apparatus or a plasma processing apparatus using a microwave as a plasma source may be also used to perform the method M1 and the method M2.

We claim:
1. A method of etching a copper layer of a target object including, on the copper layer, a first mask having a pattern to be transferred onto the copper layer, the method comprising:
forming the pattern of the first mask by etching a stacked body having a first layer that is made of silicon nitride or silicon oxide and is formed on the copper layer and a second layer that is made of TiN and is formed on the first layer;
etching the copper layer by using plasma of a first gas containing a hydrogen gas; and
processing the target object by using plasma of a second gas containing a hydrogen gas and a gas that is deposited on the target object,
wherein the etching of the copper layer by using plasma of the first gas and the processing of the target object by using plasma of the second gas are repeated alternately, and wherein the forming of the pattern of the first mask comprises:
etching the second layer by using plasma of a chlorine-containing gas; and
etching the first layer by using plasma of a fluorocarbon-based gas.

2. The method of claim 1,
wherein a second mask containing carbon is formed on the second layer of the first mask, and
the forming of the pattern of the first mask further comprises removing the second mask by exposing the second mask into plasma of an oxygen-containing gas between the etching of the second layer by using plasma of the chlorine-containing gas and the etching of the first layer by using plasma of the fluorocarbon-based gas.

3. The method of claim 1,
wherein the gas that is deposited on the target object is a methane gas.

* * * * *